(12) United States Patent
Kam et al.

(10) Patent No.: US 9,172,132 B2
(45) Date of Patent: *Oct. 27, 2015

(54) INTEGRATED ANTENNA FOR RFIC PACKAGE APPLICATIONS

(71) Applicant: INTERNATIONAL BUSINESS MACHINES CORPORATION, Armonk, NY (US)

(72) Inventors: Dong G. Kam, Seoul (KR); Duixian Liu, Scarsdale, NY (US); Scott K. Reynolds, Amawalk, NY (US)

(73) Assignee: GLOBALFOUNDRIES INC, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/603,856

(22) Filed: Jan. 23, 2015

(65) Prior Publication Data

US 2015/0129668 A1    May 14, 2015

Related U.S. Application Data

(63) Continuation of application No. 13/029,657, filed on Feb. 17, 2011, now Pat. No. 8,988,299.

(51) Int. Cl.
G06K 19/06    (2006.01)
H01Q 1/22    (2006.01)
(Continued)

(52) U.S. Cl.
CPC ........ *H01Q 1/2283* (2013.01); *G06K 19/07775* (2013.01); *H01L 23/66* (2013.01);
(Continued)

(58) Field of Classification Search
CPC ............. H01Q 23/00; G06K 19/07749; G07F 7/1008; B42D 15/10

USPC .................................. 235/492, 487; 343/767
IPC .. H01Q 23/00; G06K 19/07749; G07K 7/1008; B42D 15/10
See application file for complete search history.

(56) References Cited

U.S. PATENT DOCUMENTS 5,023,624 A    6/1991    Heckaman et al.
6,989,791 B2    1/2006    Navarro et al.
(Continued)

FOREIGN PATENT DOCUMENTS

WO    WO03047033 A1    6/2003

OTHER PUBLICATIONS

Shengcai, J., et al. "Monopole Crescent Elliptical Antenna With Band-Notched Characteristics for UWB Applications" Tsinghua Science and Technology, vol. 14, No. 4. Aug. 2009, pp. 460-464.

(Continued)

*Primary Examiner* — Karl D Frech
(74) *Attorney, Agent, or Firm* — Tutunjian & Bitetto, P.C.

(57) ABSTRACT

A chip package includes a set of layers including conductive planes connected by vias. A first portion has at least one antenna, antenna ground plane, and first grounded vias. A second portion has a conductive plane parallel to the ground plane that forms an interface for connecting to at least one integrated circuit device. A third portion between the first and the second portion has a vertical transmission line that includes a signal via connecting the antenna feed line to the at least one integrated circuit and a parallel-plate mode suppression mechanism. The parallel-plate mode suppression mechanism includes a grounded reflector that forms a cage with the grounded vias around an antenna region and further includes second ground vias surrounding the signal via.

15 Claims, 6 Drawing Sheets

(51) Int. Cl.
    *H01Q 3/30*     (2006.01)
    *H01Q 9/04*     (2006.01)
    *H01Q 9/06*     (2006.01)
    *H01Q 21/06*     (2006.01)
    *H01L 23/66*     (2006.01)
    *G06K 19/077*     (2006.01)
    *H01L 23/00*     (2006.01)

(52) U.S. Cl.
    CPC .............. *H01Q 3/30* (2013.01); *H01Q 9/0407* (2013.01); *H01Q 9/065* (2013.01); *H01Q 21/065* (2013.01); *H01L 24/16* (2013.01); *H01L 2223/6616* (2013.01); *H01L 2223/6677* (2013.01); *H01L 2224/16225* (2013.01); *H01L 2224/73253* (2013.01); *H01L 2924/09701* (2013.01); *H01L 2924/1421* (2013.01); *H01L 2924/15321* (2013.01)

(56) References Cited

U.S. PATENT DOCUMENTS

| | | | |
|---|---|---|---|
| 7,671,696 | B1 | 3/2010 | Puzella et al. |
| 7,675,465 | B2 | 3/2010 | Doan et al. |
| 7,696,930 | B2 | 4/2010 | Akkermans et al. |
| 7,728,774 | B2 | 6/2010 | Akkermans et al. |
| 7,791,539 | B2 | 9/2010 | Soler Castany et al. |
| 8,988,299 | B2 * | 3/2015 | Kam et al. .................... 343/767 |
| 2009/0273517 | A1 | 11/2009 | Thiesen et al. |

OTHER PUBLICATIONS

Song, C.T.P., et al. "Novel Antenna for Packaged Integrated RF Front Ends" Proceedings of 2000 International Symposium on Antennas and Propagation (ISAP 2000). Aug. 2000. (4 Pages).

\* cited by examiner

INTEGRATED ANTENNA FOR RFIC PACKAGE APPLICATIONS

RELATED APPLICATION DATA

This application is a Continuation application of co-pending U.S. patent application Ser. No. 13/029,657 filed on Feb. 17, 2011, incorporated herein by reference in its entirety.

BACKGROUND

1. Technical Field

The present invention relates to antenna and feed line designs for radio frequency integrated circuit (RFIC) chip packages, and, more particularly, to chip packaging with integrated antennas or planar phased array designs with high performance antennas and their feed lines for millimeter-wave frequencies and above.

2. Description of the Related Art

In a wireless network, the connectivity and communication between devices is achieved through antennas attached to receivers or transmitters which radiate signals to/from other elements in the network. In radio communication systems, such as millimeter-wave radios, discrete components are usually assembled with low integration levels. These systems often employ expensive, bulky waveguides and package-level or board-level microstrip structures to interconnect semiconductors and their required transmitter or receiver antennas. Dimensions of these radio communication systems have become smaller, and the integration of antennas with their radio frequency (RF) front-end circuits has become more desirable.

For applications such as wireless USB, the operating distance is limited to about a meter; and a single antenna with about 7 dBi at 60 GHz will provide the necessary antenna gains. For distances as long as 10 meters (such as wireless video) or longer, point to point applications (such as radar) having antenna gains as high as 30 dBi, depending on the application, are required. High gain antennas for wireless video applications have a very narrow beam width; this makes aiming the antenna very difficult for consumers. Therefore, a radiation pattern steerable array (also a phased array) is needed. Phased arrays are widely used in military radars. However, packaging RF chips with integrated antennas or phase arrays is extremely difficult and very expensive due to expensive components and extensive labor.

SUMMARY

A chip package includes a set of layers including conductive planes connected by vias. A first portion has at least one antenna, antenna ground plane, and first grounded vias. A second portion has a conductive plane parallel to the ground plane that forms an interface for connecting to at least one integrated circuit device. A third portion between the first and the second portion has a vertical transmission line that includes a signal via connecting the antenna feed line to the at least one integrated circuit and a parallel-plate mode suppression mechanism. The parallel-plate mode suppression mechanism includes a grounded reflector that forms a cage with the grounded vias around an antenna region and further includes second ground vias surrounding the signal via.

A system includes a radio frequency integrated circuit (RFIC). A package structure includes a plurality of layers having conductive planes connected by vias. The package structure has a first portion and a second portion on opposing sides, the first portion including at least one antenna and ground plane integrated in the package structure, the second portion including pads to bond with the RFIC and at least one conductive plane parallel to the ground plane. A vertical transmission line that includes a signal via connecting the antenna feed line to the RFIC. A parallel-plate mode suppression mechanism includes a grounded reflector and first grounded vias to at least partially form a cage round an antenna region, the reflector further including second ground vias surrounding the signal via.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
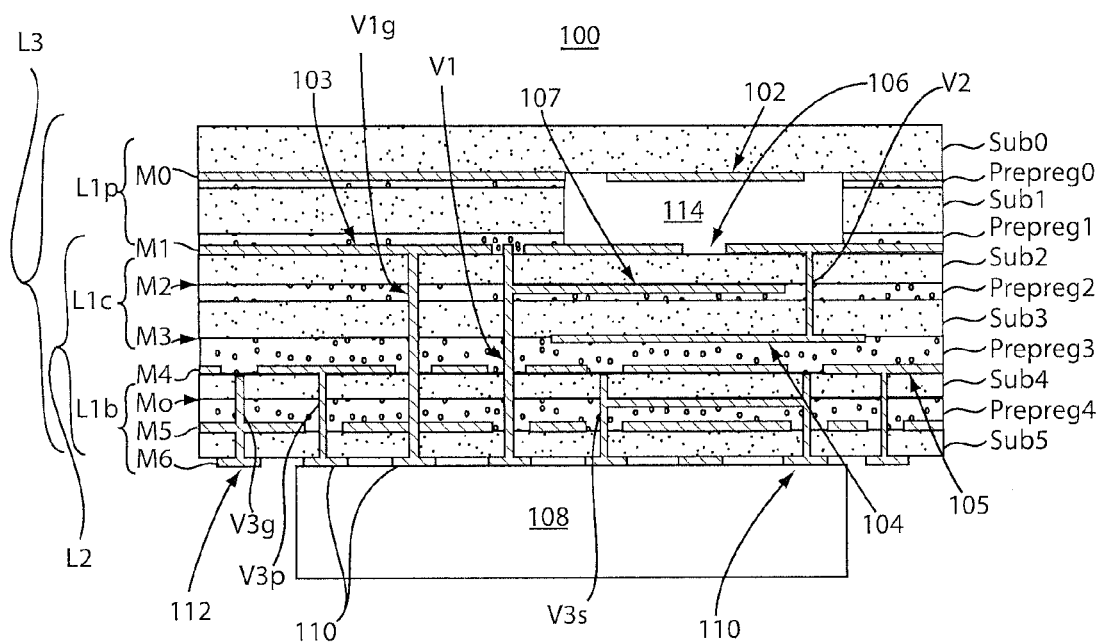
FIG. 1 is a cross-sectional view of an illustrative package structure in accordance with one embodiment.

In accordance with the present principles, devices, systems and methods are provided for low cost packages with integrated antennas, phased arrays and high performance transmission lines operating in, e.g., the millimeter wave (mmWave) range. The packages with integrated antennas are based on multilayer printed circuit board (PCB) or low temperature cofired ceramic (LTCC) technologies. The packages include a top portion for high performance antennas and a bottom portion interfacing with radio frequency integrated circuit (RFIC) chips. The packaging technology in accordance with the present principles is consistent with PCB and LTCC manufacturing processes and can be used for packages with an integrated antenna or antenna array.

The phased array architecture in one embodiment can be implemented in thin film technology, printed circuit board (PCB) technology or LTCC technology. One advantage of the architecture is that all antenna elements can be implemented in a planar way and an RFIC module can be packaged with the antenna elements simultaneously. The phased array configurations provide high antenna performance while maintaining easy manufacturability. In one embodiment, a package includes aperture-coupled patch antennas. In another embodiment, a package includes slot antennas.

The flowchart and block diagrams in the Figures illustrate the architecture, functionality, and operation of possible implementations of systems, methods and devices according to various embodiments of the present invention. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is also to be understood that the present invention will be described in terms of a given illustrative architecture; however, other architectures, structures, substrate materials and process features and steps may be varied within the scope of the present invention.

The circuits as described herein may be part of a design for an integrated circuit or chip assemblies. The designs may be created in a graphical computer programming language, and stored in a computer storage medium (such as a disk, tape, physical hard drive, or virtual hard drive such as in a storage access network). If the designer does not fabricate boards or chips or the photolithographic masks used to fabricate boards/chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the design in question that are to be formed on a wafer or PCB. The photolithographic masks are utilized to define areas of the wafer or board (and/or the layers thereon) to be etched or otherwise processed.

The methods as described herein may be used in the fabrication of integrated circuits and assemblies. The resulting integrated circuits can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In the present embodiments, chip packages with integrated antennas have two major portions. One portion is provided for implementing antennas and another portion is provided for interfacing with RFIC chips. One problem with conventional designs is that parallel-plate modes may exist in the package due to multiple ground planes. Parallel-plate modes reduce antenna efficiency and increase coupling between antennas. As a result, antenna array performance, especially phased-array performance, deteriorates.

Referring now to the drawings in which like numerals represent the same or similar elements and initially to FIG. 1, a cross-sectional view of a package structure 100 is shown in accordance with one illustrative embodiment. The structure 100 provides a mechanism to suppress or reduce parallel-plate modes and provides more feed line options using a cavity-backed aperture-coupled patch antenna 102. The aperture-coupled patch antenna 102 is implemented on a top section of the package 100. A reflector 104 is grounded with a via or vias V2. The reflector 104 and vias V2 form a cage below an aperture/slot 106 to at least partially surround the antenna area.

Parallel-plate modes are excited by the aperture 106. The parallel-plate modes are strong if the aperture also radiates, which is the case for wideband applications. By placing a cage (using reflector 104 and vias V2) below the aperture 106, parallel-plate modes will be reduced. A spacing Sv (FIG. 2) between V2 vias may be, e.g., less than 0.25 times the wavelength of the antenna operating frequency to prevent RF leakage. RF connections between the antenna 102 and an RFIC chip 108 are vertical coaxial-like transmission lines realized with vias V1 and V1g. The signal line vias (120) are vertically disposed surrounded by ground vias (V1g) (see FIG. 2).

The aperture-coupled patch antenna 102 is implemented on a top section of the package 100. The package 100 has at least two ground planes, one ground plane 103 for the antenna in metal layer M1 and another ground plane in metal layer M3 for the reflector 104. A power plane 105 can also function as the reflector for the antenna to reduce the back radiation. The reflector 104 may be implemented somewhere between the power plane 105 and an antenna feed line 107.

The antenna 102 is coupled to the RFIC chip 108 through the antenna feed line 107 which undergoes a vertical transition. The vertical transition (signal via V1) has good performance, since it behaves like a coaxial cable with an outside shield formed with grounded vias, e.g., V1g.

A package interface to the chip 108 and a printed circuit board (PCB) (not shown) is implemented at a bottom section of the package 100. There are three types of interface pads on the bottom of the package 100: 1) pads 110 connecting chip 108 to package 100, 2) pads 112 connecting package 100 to PCB (not shown), and 3) pads (not shown) connecting chip 108 to PCB.

Via V3g is a ground plane via, and via V3p is a power plane via. Via V3s is a signal via. For array applications, optional metal layer Mo may be employed to reduce package layout complexities. Metal layer M5 is a ground plane for the chip 108. Metal layer M1 is a ground plane for the antenna 102 and aperture/slot 106. Metal layer M0 forms the antenna 102. Metal layer M3 is employed for the reflector 104. Metal layer M6 is employed for pads (110, 112). Metal layers M2, M4 and M6 as well as portions of other metal layers form metal lines and connections between components. It should be understood that a greater number or fewer metal layers and different configurations thereof may be employed within the scope of the present principles. For example, depending on the application, more metal and substrate layers can be added between the power plane M4 and chip ground plane M5.

In one embodiment, printed circuit board (PCB) technology is employed. In that instance, the package 100 may include, e.g., substrate layers Sub0-Sub5 on which the metal layers are patterned and prepreg (or adhesive) layers Prepreg0-Prepreg4. A different number of layers may also be employed.

Figure 2:
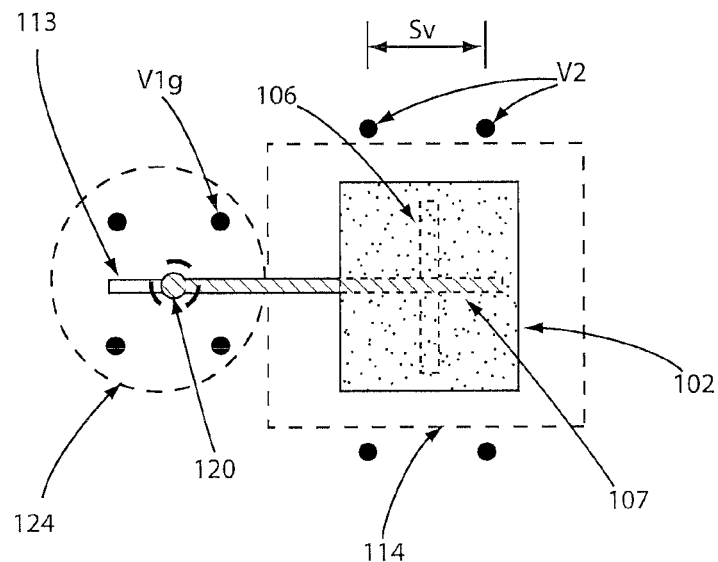
FIG. 2 is a planar view of the illustrative package structure of FIG. 1 showing a feed line for a patch antenna in accordance with the embodiment.

Referring to FIG. 2, a planar view of the package 100 is shown. The slot 106 and cavity 114 are shown in phantom lines. The spacing Sv between vias V2 is shown. A signal via V1 120 couples a feed line 113 on a different layer to a feed line 107 for the antenna/patch 102. The signal via 120 is surrounded by ground vias (e.g., V1g) to provide a vertical transition 124.

Referring again to FIG. 1, if the package 100 is manufactured with PCB technology, the package 100 can be made in three stages. In a first stage, metal structures on metal layers M4, optional Mo, M5 and M6 can be made and substrates Sub4, Prepreg4 and Sub5 are laminated together. The plated-through holes (vias V3g, V3p, V3s) are fabricated afterward. This forms L1b. Metal structures on metal layers M1, M2 and M3 can be made, and substrates Sub2, Prepreg2 and Sub3 are laminated together. The plated-through holes (vias V2) are made afterward. This forms L1c. A lamination process may be employed to form L1p.

In a second stage, L1b, Prepreg3 and L1c are laminated together, and plated-through holes (vias V1 and V1g) are made afterward. This forms L2. In a third stage, L2, L1p (Sub0, Prepreg0, Sub1), and Prepreg1 are laminated together.

To reduce a number of via depth types, via V1 may stop at the antenna ground plane level (M1), instead of at the feed line level (M2), but with an antipad so that the via V1 does not touch the ground plane. In the same way, V3s stops at the power plane level (M4), instead of at the metal Mo level, but with an antipad so that the via V3s does not touch the power plane. Via V3g may stop at the metal layer M5, but may reach the M4 level using an antipad. Alternately, low temperature cofired ceramic (LTCC) based technology can make embedded vias.

Figure 3:
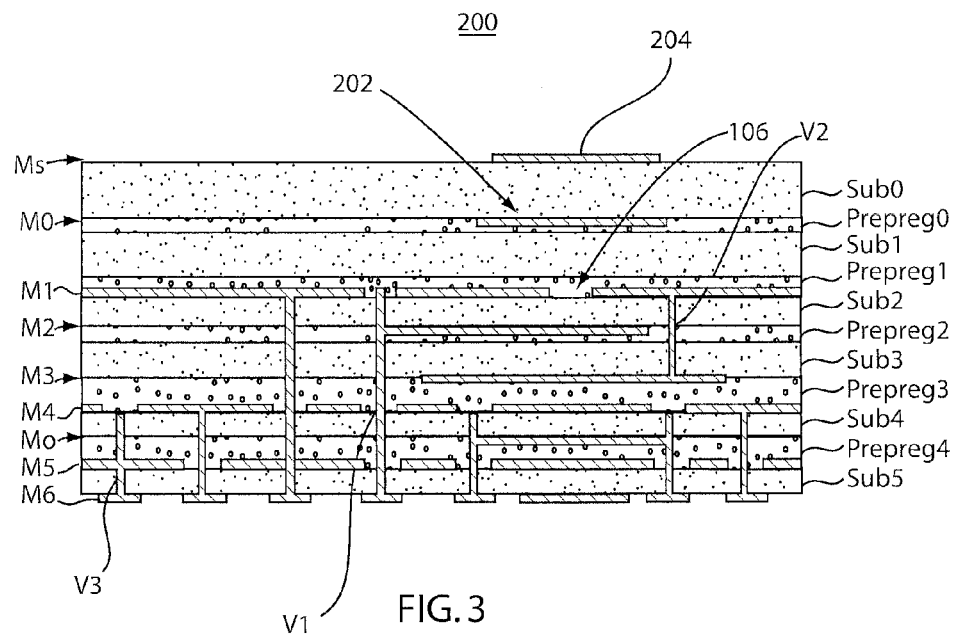
FIG. 3 is a cross-sectional view of an illustrative package structure showing a stacked patch antenna in accordance with another embodiment.

Referring to FIG. 3, a package structure 200 implements aperture-coupled stacked patch antennas 202, 204. In this embodiment, no cavity is employed and the patch 204 is formed on Sub0 in a metal layer Ms. The patch 202 is formed on metal layer M0.

Figure 4:
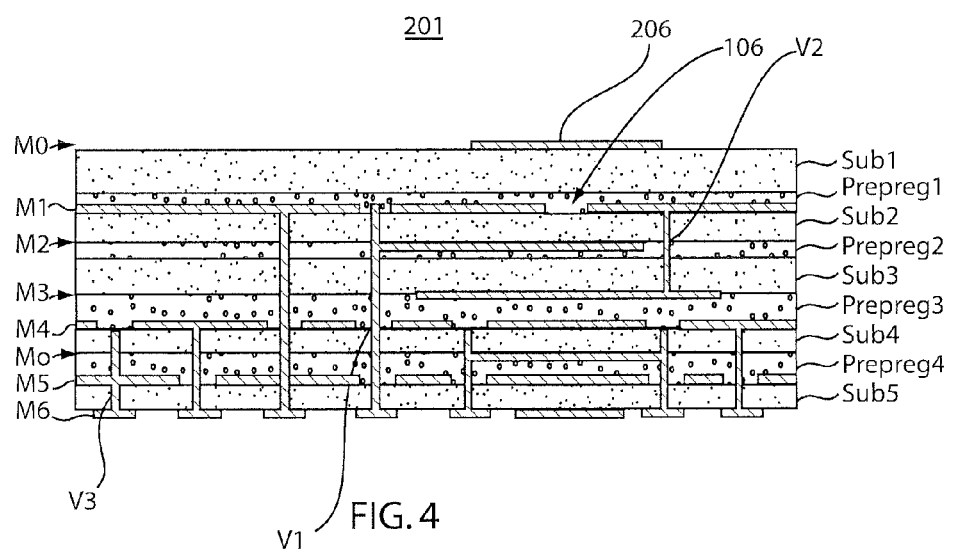
FIG. 4 is a cross-sectional view of an illustrative package structure showing a regular aperture-coupled patch antenna in accordance with another embodiment.

Referring to FIG. 4, if the antenna bandwidth requirement is not critical, a package structure 201 may include a regular aperture-coupled patch antenna 206. Patch 206 is formed on Sub1 in metal layer M0 with no cavity. The package production cost is lowered since no internal cavity is used.

Figure 5:
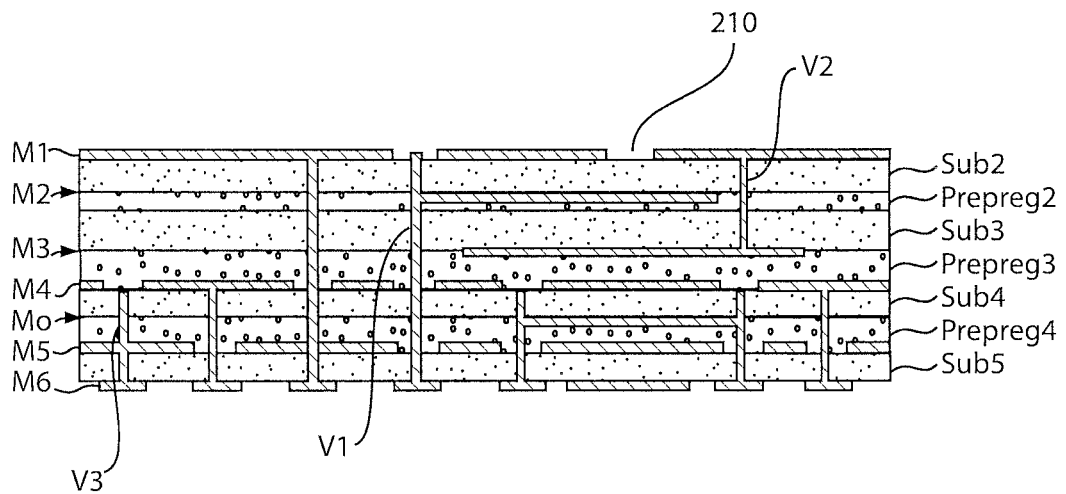
FIG. 5 is a cross-sectional view of an illustrative package structure showing a slot or slot loop antenna in accordance with another embodiment.

Referring to FIG. 5, other antenna structures may be employed in the package structure of the present principles. A slot or slot loop antenna 210 may be employed, for example.

Figure 6:
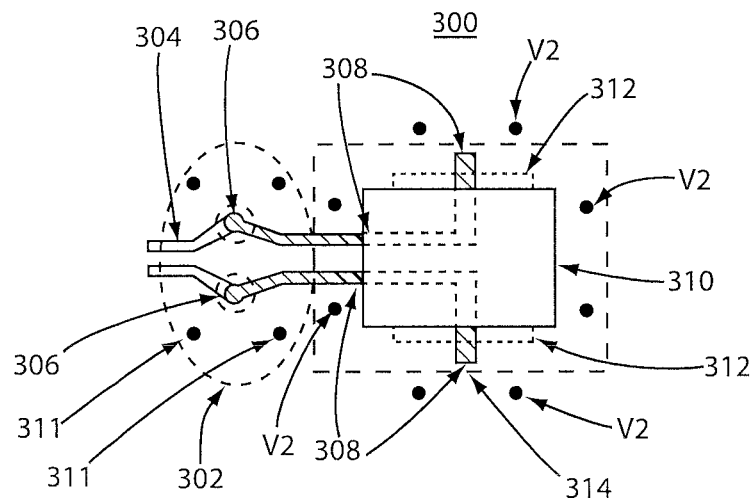
FIG. 6 is a planar view of an illustrative package structure showing a differential feed line arrangement in accordance with another embodiment.

Referring to FIG. 6, a planar view of a vertical differential transition implementation 300 is illustratively shown. In applications where differential-fed antennas are needed, a vertical differential transition 302 can be accommodated in the present package structure. The differential feed method can be employed with, e.g., the cavity-backed patch antenna of FIG. 1, the stacked patch antenna of FIG. 3, the regular patch antenna of FIG. 4, or the slot (or slot loop) antenna of FIG. 5.

The vertical transition 302 includes a differential feed line 304 from someplace in the package, e.g., on the bottom surface of the package. Differential signal vias 306 carry the signals to differential feed lines 308 which interact with a patch 310 and slots 312 to propagate the differential signal. A cavity 314 and slots 312 are depicted in phantom lines. The vias 306 are surrounded by ground vias 311.

Figure 7:
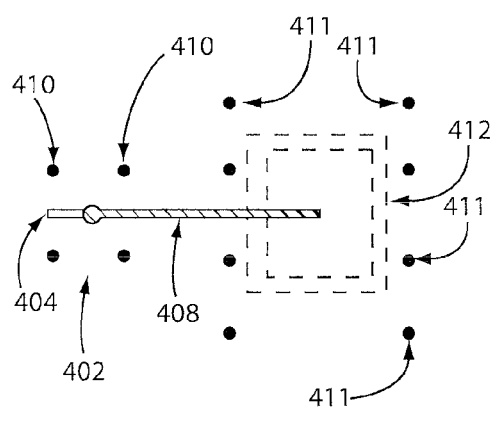
FIG. 7 is a planar view of an illustrative package structure showing a single feed line slot loop antenna in accordance with another embodiment.
Figure 8:
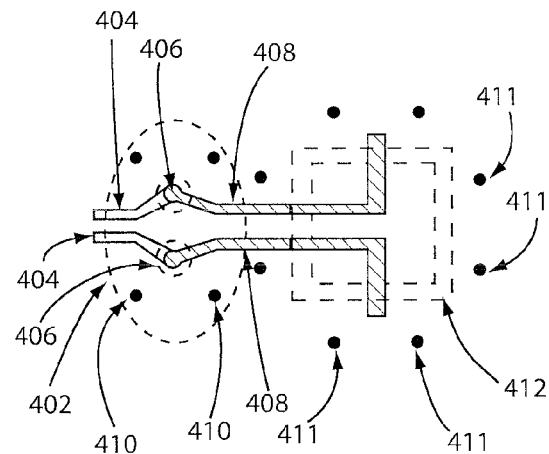
FIG. 8 is a planar view of an illustrative package structure showing a differential feed line slot loop antenna in accordance with another embodiment.

Referring to FIGS. 7 and 8, planar views of package structures using slot loop antennas with single-ended (FIG. 7) or differential feed lines (FIG. 8) are shown. A slot loop 412 is shown in phantom lines. A vertical transition 402 includes feed lines 404 from someplace in the package. The vertical transition is surrounded by ground vias 410. Signal vias 406 carry the signals to feed lines 408 which interact with slot loops 412 to propagate the signal. Ground vias 411 surround the slot region as well.

Figure 9:
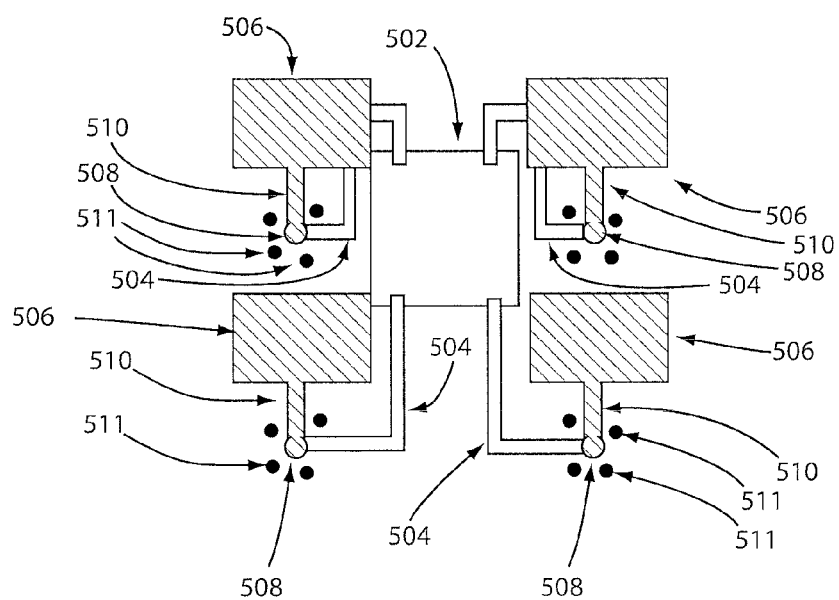
FIG. 9 is a schematic view of a four-element phased array in accordance with the present principles.

Referring to FIG. 9, a 2×2 (4-element) phased array 500 is shown in accordance with the present principles. The phased array may include any number of elements, but in this example 4 elements are illustratively depicted. All four antennas are in a same package (e.g., package 100 or other package in accordance with the present principles). In this embodiment, the array 500 includes a single RFIC chip 502 with four feed lines 504 to each antenna 506. The antennas 506 include patch antennas in this embodiment although other antennas may be employed. The feed lines 504 connect to a signal via 508, which is surrounded by ground vias 511. The signal via 508 connects to a feed line 510 for each patch antenna 506. As before the patches 506 have a corresponding reflector and vias that form a cage to reduce parallel-plate modes.

Figure 10:
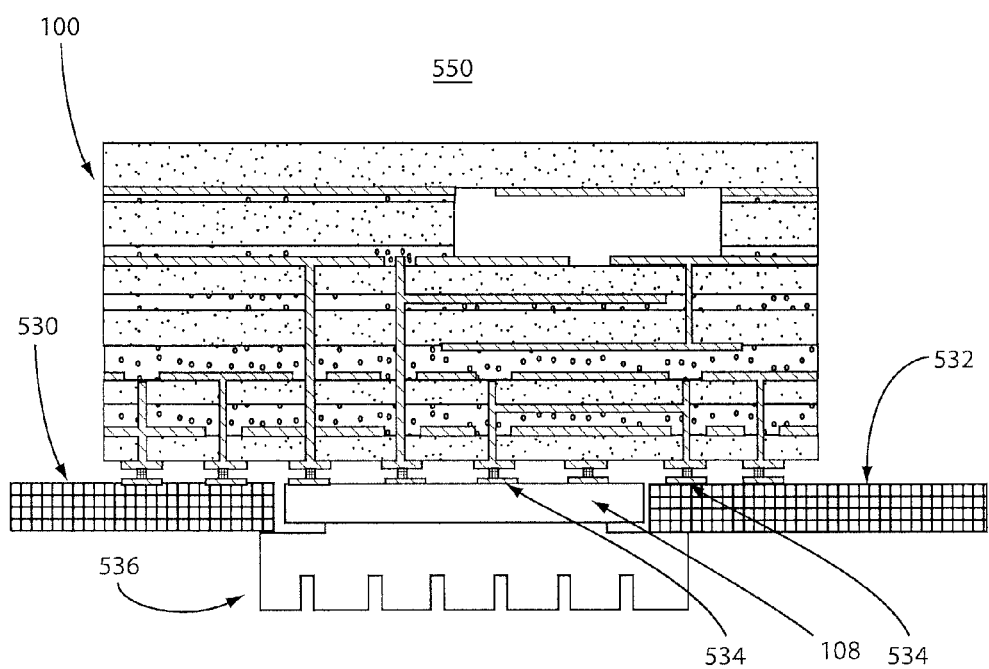
FIG. 10 is a cross-sectional view of the illustrative package structure of FIG. 1 incorporated into a system including a motherboard or printed circuit board, radio frequency integrated circuit (RFIC) and a heat sink in accordance with one embodiment.

Referring to FIG. 10, an illustrative configuration 550 includes the package 100 having an RFIC chip 108 attached along with two PCBs 530 and 532. Pads 534 connecting RFIC chip 108 to PCB 532 through the package 100 are illustratively depicted. If heat is an issue in the configuration 550, a heat sink 536 may be employed and attached to the RFIC chip 108 and/or the PCBs 530 and 532. The PCB's 530 and 532 may be separate PCBs or may be a single PCB (a motherboard or the like).

Figure 11:
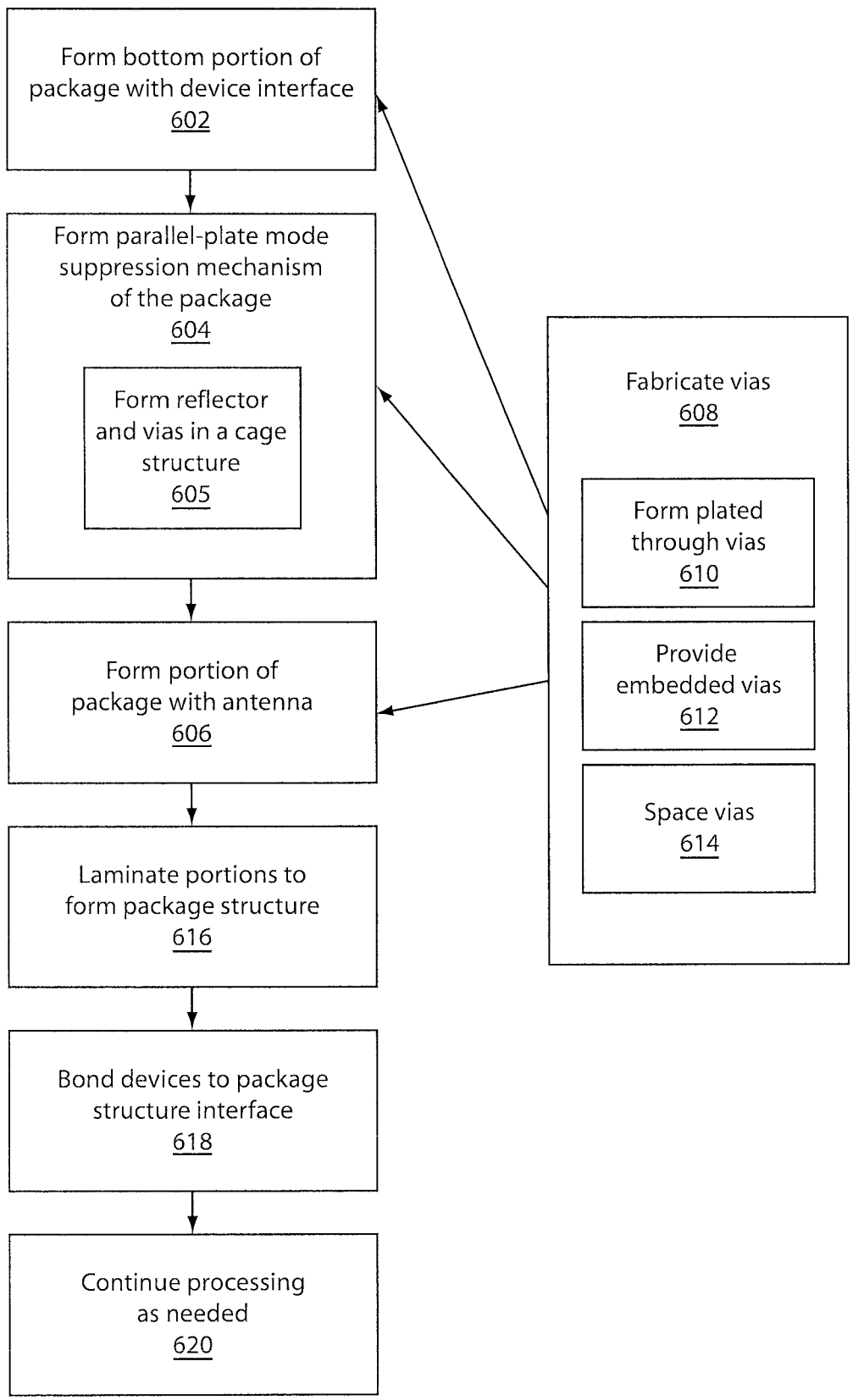
FIG. 11 is a flow diagram showing a method for fabricating a package structure in accordance with one illustrative embodiment.

Referring to FIG. 11, a method for fabricating a package structure with suppressed parallel-plate mode excitation for an integrated antenna is illustratively shown. In block 602, a portion (e.g., a bottom) of a package structure using substrates with metal layers formed thereon is provided. The substrates may include prepregnated boards (epoxy resin boards) or other substrate boards or materials. The boards or substrates include metal layers formed and patterned thereon using known methods. The portion provides an interface for at least one integrated circuit chip. The interface includes pads to connect to the at least one integrated circuit, to connect to an external printed wiring board (e.g., a motherboard), etc. The pads are preferably external to the package and permit the integrated circuit (e.g., RFIC) or PCBs to be connected externally to the package. This obviates the need to form cavities, recesses or other features within the package itself and thereby reduces cost.

In block 604, a parallel-plate mode suppression mechanism is formed for the package structure using substrates with metal layers and vias. In one embodiment, the parallel-plate mode suppression mechanism includes a reflector and first grounded vias to form a cage structure. In block 605, the parallel-plate mode suppression mechanism preferably includes forming the reflector and the antenna ground plane on separate layers and having a different footprint for the reflector and the antenna ground plane.

In block 606, another (e.g., top) portion of the package structure is formed using substrates with metal layers formed thereon to provide an integrated antenna. The antenna may include a regular patch antenna, a stacked patch antenna, a cavity-backed aperture-coupled patch antenna, a slot antenna, a slot loop antenna, etc. The antenna may include single or differential feed lines. A plurality of antennas may be employed in a phased array.

In block 608, fabricating vias is performed. In one embodiment, plated-via through holes are formed after forming each of the portions, (e.g., top and bottom) and the parallel-plate mode suppression mechanism in block 610. In block 612, vias are fabricated/provided as embedded vias using low temperature cofired ceramic (LTCC) technology. In block 614, the first grounded vias include a spacing dependent on an operating wavelength of the antenna, e.g., less than 0.25 times an operating wavelength of the antenna.

In block 616, the portions (e.g., top and bottom) and the parallel-plate mode suppression mechanism are laminated such that the cage structure at least partially encloses an antenna region and the reflector is preferably vertically and horizontally offset from an antenna ground plane. In block 618, the at least one integrated circuit chip may include a radio frequency integrated circuit (RFIC), PCB, etc. The RFIC, PCB, etc. may be bonded to bond pads of the bottom portion. In block 620, processing continues, as needed.

Having described preferred embodiments integrated antennas for RFIC package applications (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A chip package, comprising:
a plurality of layers including conductive planes connected by vias, the layers including:
a first portion having at least one antenna, antenna ground plane, and first grounded vias formed therein;
a second portion having a conductive plane parallel to the ground plane that forms an interface for connecting to at least one integrated circuit device; and
a third portion between the first and the second portion comprising:
a vertical transmission line that includes a signal via connecting the antenna feed line to the at least one integrated circuit; and
a parallel-plate mode suppression mechanism, the parallel-plate mode suppression mechanism including a grounded reflector that forms a cage with the grounded vias around an antenna region and further including second ground vias surrounding the signal via.

2. The chip package as recited in claim 1, wherein the at least one integrated circuit includes a radio frequency integrated circuit chip.

3. The chip package as recited in claim 1, wherein the at least one integrated circuit includes a printed circuit board.

4. The chip package as recited in claim 1, wherein the first grounded vias include a spacing dependent on an operating wavelength of the antenna.

5. The chip package as recited in claim 1, wherein the first grounded vias include a spacing of less than 0.25 times an operating wavelength of the antenna.

6. The chip package as recited in claim 1, wherein the antenna includes one of a regular, a stacked or a cavity-backed aperture-coupled patch antenna.

7. The chip package as recited in claim 1, wherein the antenna includes one of a slot or a slot loop antenna.

8. The chip package as recited in claim 1, wherein the vertical transmission line includes differential transmission lines for a differential antenna.

9. A system, comprising:
a radio frequency integrated circuit (RFIC);
a package structure including a plurality of layers having conductive planes connected by vias;
the package structure having a first portion and a second portion on opposing sides, the first portion including at least one antenna and ground plane integrated in the package structure, the second portion including pads to bond with the RFIC and at least one conductive plane parallel to the ground plane;
a vertical transmission line that includes a signal via connecting the antenna feed line to the RFIC; and
a parallel-plate mode suppression mechanism, the parallel-plate mode suppression mechanism including a grounded reflector and first grounded vias to at least partially form a cage round an antenna region, the reflector further including second ground vias surrounding the signal via.

10. The system as recited in claim 9, wherein the second portion includes additional pads to connect to a printed circuit board.

11. The system as recited in claim 9, wherein the first grounded vias include a spacing dependent on an operating wavelength of the antenna.

12. The system as recited in claim 9, wherein the first grounded vias include a spacing of less than 0.25 times an operating wavelength of the antenna.

13. The system as recited in claim 9, wherein the antenna includes one of a regular, a stacked or a cavity-backed aperture-coupled patch antenna.

14. The system as recited in claim 9, wherein the antenna includes one of a slot or a slot loop antenna.

15. The system as recited in claim 9, wherein the vertical transmission line includes differential transmission lines for a differential antenna.

* * * * *